United States Patent
Wong et al.

[11] Patent Number: 5,923,585
[45] Date of Patent: Jul. 13, 1999

[54] SOURCE BIASING IN NON-VOLATILE MEMORY HAVING ROW-BASED SECTORS

[75] Inventors: Sau C. Wong, Hillsborough; Hock C. So, Redwood City, both of Calif.

[73] Assignee: Invox Technology, Campbell, Calif.

[21] Appl. No.: 08/781,741

[22] Filed: Jan. 10, 1997

Related U.S. Application Data

[51] Int. Cl.$^6$ .................................................. G11C 11/34
[52] U.S. Cl. ................................. 365/185.03; 365/185.18
[58] Field of Search .................. 365/185.23, 185.12, 365/185.18, 185.03, 185.16

[56] References Cited

U.S. PATENT DOCUMENTS

| | | | |
|---|---|---|---|
| 5,428,568 | 6/1995 | Kobayashi | 365/185.24 |
| 5,521,864 | 5/1996 | Kobayashi et al. | 365/185.12 |
| 5,612,913 | 3/1997 | Cappelletti et al. | 365/185.12 |
| 5,627,779 | 5/1997 | Odake et al. | 365/185.12 |
| 5,646,886 | 7/1997 | Brahmbhatt | 365/185.16 |

*Primary Examiner*—A. Zarabian
*Attorney, Agent, or Firm*—Skjerven, Morrill, Macpherson, Franklin & Friel LLp; Tom Chen

[57] ABSTRACT

A non-volatile memory includes an array of memory cells that is partitioned into sectors with sources of memory cells in each sector coupled together but electrically isolated from sources of memory cells in other sectors. Each sector includes one or more rows of memory cells, and sources of memory cells in each row are coupled together by a source-line. During programming of a selected memory cell, a bias circuit grounds a source-line in the sector containing the selected memory cell and applies a bias voltage to the source-lines in the other sectors. The bias voltage reduces program disturb of memory cells that are connected to the same bit-line as the selected memory cell. The bias circuit is coupled to address decode circuitry that indicates which source-line should be grounded.

15 Claims, 4 Drawing Sheets

5,923,585

SOURCE BIASING IN NON-VOLATILE MEMORY HAVING ROW-BASED SECTORS

BACKGROUND OF THE INVENTION

1. Field of the Invention

This invention relates to circuits and methods for reducing write disturb in non-volatile memory and particularly reducing write disturb in non-volatile analog and multilevel memory.

2. Description of Related Art

Non-volatile semiconductor memories such as EPROM, EEPROM, and Flash memories are well known. In such memories, a threshold voltage of a memory cell indicates a data value stored in the memory cell. When writing to a selected memory cell in a conventional non-volatile memory array, programming voltages are applied via a word-line connected to a control gate of the selected cell, a bit-line connected to a drain of the selected cell, and a source-line coupled to a source of the selected cell. The combination of programming voltages changes the threshold voltage of the selected cell typically by causing Fowler-Nordheim (F-N) tunnelling or channel hot electron (CHE) injection which charges (or discharges) a floating gate in the selected memory cell. For example, to induce CHE injection in a selected memory cell containing a typical N-channel floating gate transistor, the word-line voltage for the selected cell is raised to about 12 volts or higher; the bit-line voltage for the selected cell is raised to about 6 volts or higher; and a source-line for the array is grounded.

During a write to a selected memory cell, the high bit-line and word-line voltages for the selected memory call can create large voltage differences between the floating gate and drain or control gate of unselected memory cells and thereby induce Fowler-Nordheim tunneling that disturbs threshold voltages of these unselected memory cells. The voltage difference between the drain and floating gate of an unselected memory cell subjects the memory cell to a disturb referred to herein as drain disturb. The voltage difference between the control gate and the floating gate of an unselected memory cell subjects the memory cell to a disturb referred to herein as gate disturb. Typically, drain disturb is more severe than gate disturb because the magnitude of the electric field in a tunnel layer between the floating gate and the drain is greater than the electric field in an interpoly dielectric layer between the floating gate and the control gate and because, theoretically, the tunneling current density I that disturbs a threshold voltage depends exponentially on an electric field E as indicated in equation 1.

Equation 1:

$$I = A * E^{2} * e^{-B/E}$$

where A and B depend on memory cell structure.

The disturbance of threshold voltages can accumulate through repeated programming of memory cells in the same column or row and change the data values stored in unselected cells. Depending on the memory, a data value stored in a memory cell may be binary (a bit 0 or 1), multi-level (a value from a set of discrete values), or analog (a value within a continuous range of possible values). For binary memories, the accumulated disturbance of a threshold voltage must be relatively large (on the order of a volt or more) to change the threshold voltage from a state indicating a first binary value to a state indicating the second binary value. For a multi-level or analog memory, distinguishable threshold voltages for data values can differ by a few millivolts, and small disturbances of threshold voltages limit the threshold voltage resolution in the memory. Accordingly, methods and circuits that reduce disturbance of threshold voltages in multi-level and analog non-volatile memories are sought.

One way to reduce threshold voltage disturb is to reduce bit-line and word-line lengths by arranging memory cells in several small arrays rather than one large array. With small arrays, fewer memory cells are on the same row or column so that programming a selected memory cell disturbs fewer unselected memory cells; and the accumulated programming disturb for each memory cell is less. For example, dividing a large array into four small arrays can divide bit-line and word-line lengths in half and reduce accumulation of threshold voltage disturbance in half. However, four small arrays have about twice the overhead in decoding circuitry as does one large array containing the same number of memory cells. Methods and circuits that reduce disturbance of threshold voltages and have low overhead costs are still needed.

SUMMARY OF THE INVENTION

In accordance with the invention, selected source-lines in a non-volatile memory are biased to reduce the worst case program disturb applied to unselected memory cells during programming of selected memory cells. Source-line voltages are separately controlled for sectors in the memory. In one embodiment, each row of memory cells in the memory has a source-line that is electrically isolated from source-lines in other rows, and each row in the array is a sector with an independently controllable source-line bias voltage. In an alternative embodiment, adjacent rows of memory cells are paired with each pair of rows sharing a source-line, and two rows of memory cells form a sector. Address decode circuitry and bias circuits coupled to the source-lines control the voltages on the source-lines according to an address signal identifying the selected memory cell.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, an erasable non-volatile memory such as an EPROM, EEPROM, or Flash memory has multiple sectors where all memory cells in a sector have the same source voltage but the source voltage for each sector is independent of the source voltage of other sectors. The sectors may be word-line based so that each sector contains all the memory cells in one, two, or more rows of a memory array. Bias circuits coupled to an address decoder control the source voltages during programming and provide a source bias voltage to unselected sectors. The source bias voltage reduces disturbances of the threshold voltages of memory cells in the unselected sectors when a selected memory cell is programmed.

Figure 1:
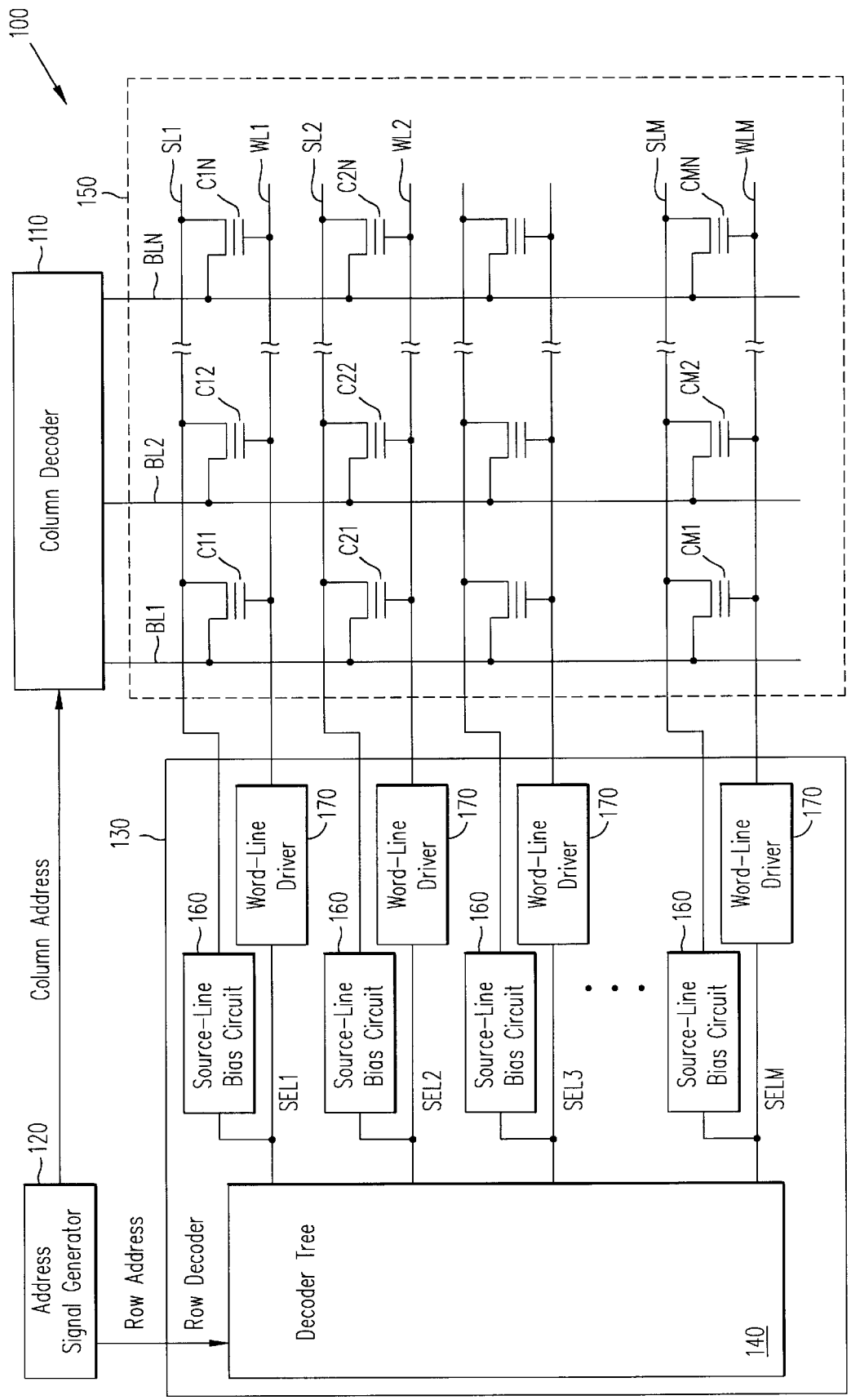
FIG. 1 is a block diagram of an embodiment of the invention that includes a memory array having one-row sectors.

FIG. 1 illustrates an erasable non-volatile memory 100 in accordance with an embodiment of the invention. Memory 100 includes a memory array 150 having M rows and N columns of memory cells C11 to CMN. In array 150, each memory cell C11 to CMN is a single n-channel floating gate transistor, but other embodiments of the invention may employ other types of memory cells such as split-gate or two-transistor memory cells. Each memory cell C11 to CMN has a control gate coupled to one of word-lines WL1 to WLM, a drain coupled to one of bit-lines BL1 to BLN, and a source coupled to one of source-lines SL1 to SLN.

When writing a data value, an address signal generator 120 provides address signals indicating a row address and a column address for a selected one of memory cells C11 to CMN to which the data value will be written. The row address identifies the row containing the selected memory cell and a word-line and a source-line coupled to the selected memory cell. The column address identifies the column containing the selected memory cell and a bit-line coupled to the selected memory cell. In one embodiment of the invention, address signal generator 120 is a buffer circuit that generates the address signals from addresses provided by circuitry external to memory 100. Alternatively, address signal generator 120 generates sequential addresses for recording analog or multi-level samples of a continuous analog signal.

For an analog non-volatile memory, writing a data value to the selected memory cells changes the threshold voltage of the selected memory cell from an erased state to a state indicating the data value being stored. The direction of the change is constant and referred to herein as the programming direction. Programming voltages are applied to the word-line, bit-line, and source-line coupled to the selected memory cell to cause the change in the threshold voltage. For example, to write an analog value to memory cell C11, a row decoder 130 grounds source-line SL1 to a reference voltage Vss and applies a programming voltage Vpp to word-line WL1; and a column decoder 110 applies programming voltage Vdp to bit-line BL1. The magnitudes of the programming voltages Vpp and Vdp depend on structure of memory cells C11 to CMN and may depend on the data value being written. If memory array 150 is a Flash memory array, typical programming voltages Vpp and Vdp are respectively about 12 volts and about 6 volts above voltage Vss, and the combination of programming voltages causes channel hot electron (CHE) injection that increases the threshold voltage of the selected memory cell.

Column decoder 110 applies programming voltage Vdp to the selected bit-line and disconnects unselected bit-lines. Column decoder 110 can be implemented using designs that are well known in the art.

Row decoder 130 contains a decoder tree 140, source-line bias circuits 160, and word-line drivers 170. Decoder tree 140 generates select signals SEL1 to SELM, each of which corresponds to a row in memory array 150 and indicates whether the corresponding row contains the selected memory cell. Word-line drivers 170 and source-line bias circuits 160 use signals SEL1 to SELM when determining the voltage to be applied to word-lines WL1 to WLM and source-lines SL1 to SLM.

Word-line drivers 170 apply a programming voltage Vpp to the word-line selected by decoder tree 140 during a write. In alternative embodiments, word-line drivers 170 either ground unselected word-lines or bias some or all of the unselected word-lines at a bias voltage to reduce program disturb. U.S. patent app. Ser. No. 08/684,788, entitled "Analog and Multi-level Memory with Reduced Program Disturb", which is incorporated by reference herein in its entirety, describes word-line drivers that bias word-lines coupled to unselected memory cells that contain data and ground word-lines coupled to unselected memory cells that are erased.

Source-line bias circuits 160 control the voltages on source-lines SL1 to SLM. Source-lines SL1 to SLM are electrically isolated from each other, so that each row of array 150 constitutes a sector having an independently controllable source voltage. In array 150, each sector (or row) can be erased independently of the other sectors.

During a write to a selected memory cell, the source-line coupled to the selected memory is grounded to reference voltage Vss, the word-line coupled to the selected memory is raised to programming voltage Vpp, and the bit-line coupled to the selected memory cell is raised to programming voltage Vdp. Applying programming voltages Vpp and Vdp to the selected word-line and bit-line also applies voltages Vpp and Vdp in different combinations to unselected memory cells and can disturb the threshold voltages of the unselected memory cells. As indicated by Equation 1, a tunneling current density I through an insulating layer such as an interpoly or tunnel dielectric layer in a non-volatile memory cell theoretically has an exponential dependence on an electric field E in the insulating layer.

Equation 1:

$$I = A * E^2 * e^{-B/E}$$

A and B are constants and are about $2.5 \times 10^{-6}$ amp/(cm*V)$^2$ and $2.5 \times 10^8$ V/cm respectively for a typical Flash-memory cell.

The gate, drain, and source of a memory cell are three possible sources of current to a floating gate that can disturb the threshold voltage of the memory cell. These three disturbances are referred to herein as gate disturb, drain disturb, and source disturb. An electric field Eg in the interpoly between the gate and floating gate causes the gate disturb and depends on a voltage drop V1 between the gate and the floating gate and an effective oxide thickness Tipox for the interpoly dielectric. Drain and source disturb are caused by electric fields Ed and Es in a tunnel dielectric. Electric field Ed or Es depends on a voltage drop V2 or V3 between the floating gate and the drain or source and on an effective oxide thickness Ttox for the tunnel dielectric as shown in equations 2.

Equations 2:

$$Eg = V1/Tipox = (Vg - Vfg)/Tipox$$

$$Ed = V2/Ttox = (Vd - Vfg)/Ttox$$

$$Es = V3/Ttox = (Vs - Vfg)/Ttox$$

In a typical Flash memory cell, Tipox is more than 200 Å, and Ttox is less than 100 Å. Voltage Vfg is the voltage on the floating gate of the memory cell. Equation 3 indicates the dependence of the floating gate voltage Vfg on: the difference δV in threshold voltage between an erased state and a programmed state; the gate, source, and drain voltages Vg, Vs, and Vd of the memory cell; and the floating gate's capacitive couplings Cg, Cs, and Cd to the control gate, the source, and the drain respectively.

Equation 3:

$$Vfg = [Cd*Vd + Cs*Vs + Cg*Vg - Cg*\delta V])/Ct$$

where Ct is the total capacitance (Cd+Cs+Cg). For a typical Flash memory cell, coupling ratios Cg/Ct, Cd/Ct, and Cs/Ct are 0.65, 0.1, and 0.25 respectively.

Table 1 shows exemplary voltages in memory cells C11, C21, C12, and C22 when writing to memory cell C11 when source-lines SL1 and SL2 are grounded. In Table 1, voltages Vg, Vs, Vd, δV, and Vfg are in volts. Disturb current densities Ig, Id, and Is are in A/cm² and determined from equation 1 assuming: A is $2.5 \times 10^{-6}$ amp/(cm*V)²; B is $2.5 \times 10^8$ V/cm; Tipox is 200 Å; and Ttox is 100 Å.

TABLE 1

Source-Lines Grounded

|     | Vg | Vd | Vs | δV | Ig       | Id       | Is       |
|-----|----|----|----|----|----------|----------|----------|
| C11 | 12 | 6  | 0  |    |          |          |          |
| C21 | 0  | 6  | 0  | 1  | <1E-255  | 1.04E-10 | <1E-255  |
|     |    |    |    | 4  | 6.7E-103 | 4.29E-6  | 5.17E-48 |
| C12 | 12 | 0  | 0  | 1  | 2.48E-38 | 8.35E-8  | 8.35E-8  |
|     |    |    |    | 4  | 3.37E-25 | 8.92E-14 | 8.92E-14 |
| C22 | 0  | 0  | 0  | 1  | <1E-255  | 9.7E-162 | 9.7E-162 |
|     |    |    |    | 4  | 1.28E-77 | 2.94E-35 | 2.94E-35 |

The worst case for program disturb is drain disturb current density Id when memory cell C21, which is in the same column as the selected memory cell C11, has a high threshold voltage. All of memory cells C31 to CM1 which are in the same column as memory cell C11 suffer a similar program disturb. The program disturb for memory cell C12 which is in the selected row is largest when the threshold voltage of memory cell C12 is low, but the worst case disturb of memory cell C12 is still about two orders of magnitude less than the worst case for memory cell C21. Accordingly, the tunneling current density Id for memory cell C21 (and the other memory cells C31 to CM1 in the selected column) is the primary concern when reducing disturbance of stored data values.

In accordance with an aspect of the invention, program disturb is reduced by applying a bias voltage Vbias to source-lines coupled only to unselected memory cells. The capacitive coupling between the sources and the floating gates of these unselected cells increases the potential of the floating gates in proportion to the bias voltage and thereby reduces the voltage drop across the tunnel layers between drains and floating gates of memory cells in the selected column.

Tables 2 and 3 show the current densities in typical Flash memory cells where a bias voltage Vbias of about 2.5 and 4 volts lowers voltage drop V2 across the tunnel layer of unselected memory cells in the same column as the selected memory cell. This reduces worst case tunneling current Id between one and two orders of magnitude for memory cells in the selected column.

TABLE 2

Vbias = 2.5V

|     | Vg | Vd | Vs  | δV | Ig       | Id       | Is       |
|-----|----|----|-----|----|----------|----------|----------|
| C11 | 12 | 6  | 0   |    |          |          |          |
| C21 | 0  | 6  | 2.5 | 1  | <1E-255  | 7.13E-13 | 3.67E-50 |
|     |    |    |     | 4  | 1.4E-152 | 2.58E-7  | 3.59E-21 |
| C12 | 12 | 0  | 0   | 1  | 2.48E-38 | 8.35E-8  | 8.35E-8  |
|     |    |    |     | 4  | 3.37E-25 | 8.92E-14 | 8.92E-14 |
| C22 | 0  | 0  | 2.5 | 1  | <1E-255  | <1E-255  | 1.60E-36 |
|     |    |    |     | 4  | 2.8E-104 | 1.04E-48 | 2.74E-17 |

TABLE 3

Vbias = 4V

|     | Vg | Vd | Vs | δV | Ig       | Id       | Is       |
|-----|----|----|----|----|----------|----------|----------|
| C11 | 12 | 6  | 0  |    |          |          |          |
| C21 | 0  | 6  | 4  | 1  | 1.5E-223 | 2.02E-14 | 5.87E-29 |
|     |    |    |    | 4  | 4.5E-212 | 3.78E-8  | 1.21E-14 |
| C12 | 12 | 0  | 0  | 1  | 2.48E-38 | 8.35E-8  | 8.35E-8  |
|     |    |    |    | 4  | 3.37E-25 | 8.92E-14 | 8.92E-14 |
| C22 | 0  | 0  | 4  | 1  | <1E-255  | <1E-255  | 5.97E-23 |
|     |    |    |    | 4  | 3.1E-130 | 8.86E-62 | 3.21E-12 |

Applying the bias voltage to unselected source-lines reduces the drain disturb of memory cells in the selected column. For the source bias voltage of about 4 volts in the exemplary flash array, the drain disturb current density Id for an unselected memory cell in the selected column is about the same as the drain disturb current density for an unselected memory cell in the selected row. However, the source bias increases the source disturb current density Is in memory cells such as memory cell C22 that are not in the selected row or the selected column.

The actual accumulated disturb of a memory cell depends not only on the magnitude of disturb current densities Ig, Id, and Is but also on the time that the current densities flow and the area through which the current densities flow. Taking time and area in account the source disturb current density Is for unselected cells has a larger effect than the relative magnitudes of the current densities might indicate because on average, a memory cell is in an unselected row more often than the memory cell is in the selected column and the area through which current density Is flows is relatively large. For example, in a memory array having 100 rows (or 100 source sectors) and 100 columns, source disturb current Is is applied for about 100 times more than the largest drain disturb current density Id, which occurs only when a memory cells is in the selected column. The overlap area between the source and floating gate may be two or three orders of magnitude greater than the overlap area between the drain and floating gate. Accordingly, if a source bias voltage is to reduce the total accumulated disturb, disturb current density Is must be about four or more orders of magnitude smaller than the reduction in the greatest drain disturb Id, and a source bias voltage of 4 volts may be too high for some memory array and memory cell geometries.

A reduction in the tunneling current results in a reduction in threshold voltage disturbance per write. Viewed in another way, the reduction in the tunneling current proportionally increases the maximum number of memory cells on a bit-line (i.e. the number of word-lines and the size of an array) allowed when accumulated threshold voltage disturb must be limited. A one order of magnitude reduction in the drain disturb provided by a source bias voltage permits the number of rows in an array to be increased by an order of magnitude while preserving a desired threshold voltage resolution. Memory array density in analog and multi-level memory can thus be increased providing more storage without extensive overhead.

Figure 2:
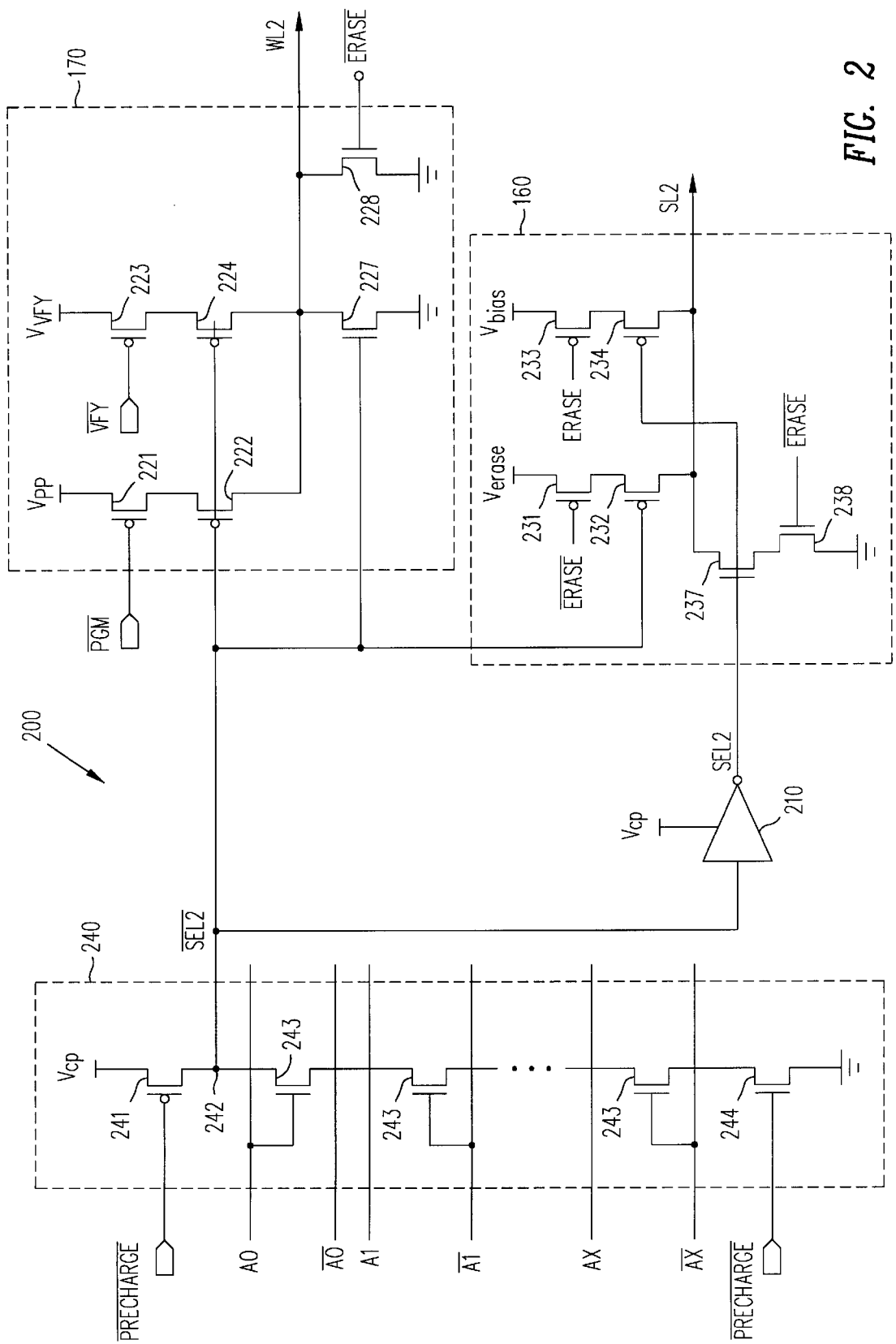
FIG. 2 is a circuit diagram of a portion of a row decoder for the embodiment of FIG. 1.

FIG. 2 illustrates an embodiment of decoding circuitry 200 that row decoder 130 uses to control voltages on word-line WL2 and source-line SL2 during an erase or program operation. Decoding circuitry 200 includes a decoder tree 240, a word-line driver 170, and a source-line bias circuit 160 which are associated with the second row of memory cells in memory array 150. For each of row in array 150, decoder 140 contains decoding circuitry similar to circuitry 200.

Decoder tree 240 generates a signal $\overline{SEL2}$ which is the complement of signal SEL2 and indicates whether the second row contains the selected memory cell. Transistors 241 and 244 control dynamic precharge for select signal $\overline{SEL2}$. Before a write, a signal $\overline{PRECHARGE}$ is asserted low which turns on p-channel transistor 241, turns off an n-channel transistor 244, and charges a node 242 (select signal $\overline{SEL2}$) to a voltage Vcp. A charge pump or other high voltage source (not shown) supplies voltage Vcp which is greater than or equal to programming voltage Vpp. Row address signals A0 to AX and $\overline{A0}$ to $\overline{AX}$ are applied to decoder tree 240 during precharge which charges a conducting string of transistors 243 connected to node 242. When signal $\overline{PRECHARGE}$ goes high, transistor 241 is turned off, and transistor 244 is turned on. Signal $\overline{SEL2}$ remains high unless transistors 243 all conduct and pull signal $\overline{SELECT2}$ low. A unique combination of row address signals A0 to AX and their compliments $\overline{A0}$ to $\overline{AX}$ is connected to the gates of transistors 243 in each copy of decode circuitry 200 so that only one signal SEL1 to SELM is asserted.

In the embodiment of FIG. 1, each row of memory array 150 is an independently erasable memory sector. In FIG. 2, word-line driver 170 and source-line bias circuit 160 control the voltages on word-line WL2 and source-line SL2 during erase and program operations. Signals $\overline{SEL2}$, $\overline{PGM}$, $\overline{VFY}$, and ERASE control word-line driver 170. During an erase of the memory cells in the second row of memory array 150, the row address identifies the second row so that signals SEL2 and $\overline{SEL2}$ are asserted high and low respectively. Signals $\overline{PGM}$ and $\overline{VFY}$ are high and turn off p-channel transistors 221 and 223. Signal ERASE is asserted (high) which turns on a transistor 228 in word-line driver 170 and grounds word-line WL2. Signal ERASE similarly causes the other word-line drivers 170 to ground the rest of the word-lines WL1 to WLM during an erase.

In source-line bias circuit 160, signals $\overline{ERASE}$ and $\overline{SEL2}$ are low during an erase of the second row and turn on p-channel transistors 231 and 232 to connect source-line SL2 to an erase voltage Verase (typically about 12V). For unselected rows, signal $\overline{SEL2}$ is high, and transistors 232 disconnect unselected source-lines from the erase voltage. Signal ERASE and $\overline{ERASE}$ turn off respective transistors 233 and 238 in each source-line bias circuit 160 so that unselected source-lines float.

For a Flash memory, column decoder 110 is disabled during the erase operation so that all of the bit-lines of array 150 are floating. To erase array 150 entirely, the row address is sequentially incremented through the entire range of rows in array 150. The erase voltage is applied for a time sufficient to change the threshold voltage of memory cells being erased to a level that characterizes an erased state.

To write a data value in a selected memory cell, address signal generator 120 generates a row address and a column address that identify the row and column containing the selected memory cell. When the selected memory cell is in the second row, decoder tree 240 asserts signal $\overline{SEL2}$ low and an inverter 210 asserts signal SEL2 high. Signals $\overline{ERASE}$ and SEL2 turn off transistors 231 and 234, respectively. Signals SEL2 and ERASE turn on n-channel transistors 237 and 238 in source-line bias circuit 160 so that source-line SL2 is grounded.

Select signals SEL1 to SELM for unselected rows are low which turns on p-channel transistors corresponding to transistor 234 and turns off n-channel transistors corresponding to transistor 237. Signal ERASE turns on p-channel transistors corresponding to transistor 233 so that source-line for unselected rows are connected to a source-line bias voltage Vbias. Bias voltage Vbias may be equal to the programming voltage Vdp or a supply voltage level to use available voltage sources. Otherwise, voltage Vbias may be at any level that reduces drain disturb but does not cause significant source disturb. Table 2 above indicates an example where voltage Vbias is 5 volts.

For the selected row, signal $\overline{SEL2}$ being low turns on p-channel transistors 222 and 224 which connects word-line WL2 to p-channel transistors 221 and 223 and enables application of voltages Vpp and Vvfy. Signals $\overline{PGM}$ and $\overline{VFY}$ control which of voltages Vpp and Vvfy are applied to the selected word-line during a write. One programming process applies programming voltage Vpp to the selected word-line during a series of programming pulses that are separated by verify cycles, during which verify voltage Vvfy is applied to the selected word-line. During each programming pulse, a signal $\overline{PGM}$ is asserted low which turns on a p-channel transistor 221 and drives the selected word-line to programming voltage Vpp. The combination of voltage Vpp on the control gate, voltage Vdp on the drain, and ground on the source of the selected memory cell causes CHE injection which increases the threshold voltage of the selected cell during the programming pulses.

During the verify cycles, a signal $\overline{VFY}$ is asserted low while signal $\overline{PGM}$ is high. This turns on a p-channel transistor 223 and shuts off p-channel transistor 221 so that the selected word-line is driven to voltage Vvfy. Voltage Vvfy is at a level indicating the data value being written and is within the range of allowed threshold voltages (typically between 2 volts and 5 volts) for memory cells in a programmed state. During verify cycles, the voltage on the selected bit-line is decreased, for example, to about 1.5 volts, and a sense circuit (not shown) determines whether the selected memory cell conducts while voltage Vvfy is applied to the control gate of the selected memory cell. When the selected cell stops conducting during a verify cycle, the threshold voltage of the selected memory cell is about equal to voltage Vvfy and is at the desired threshold voltage to represent the analog or multi-level data value being written. Further programming pulses are terminated, and the write to the selected memory cell is complete.

Figure 3:
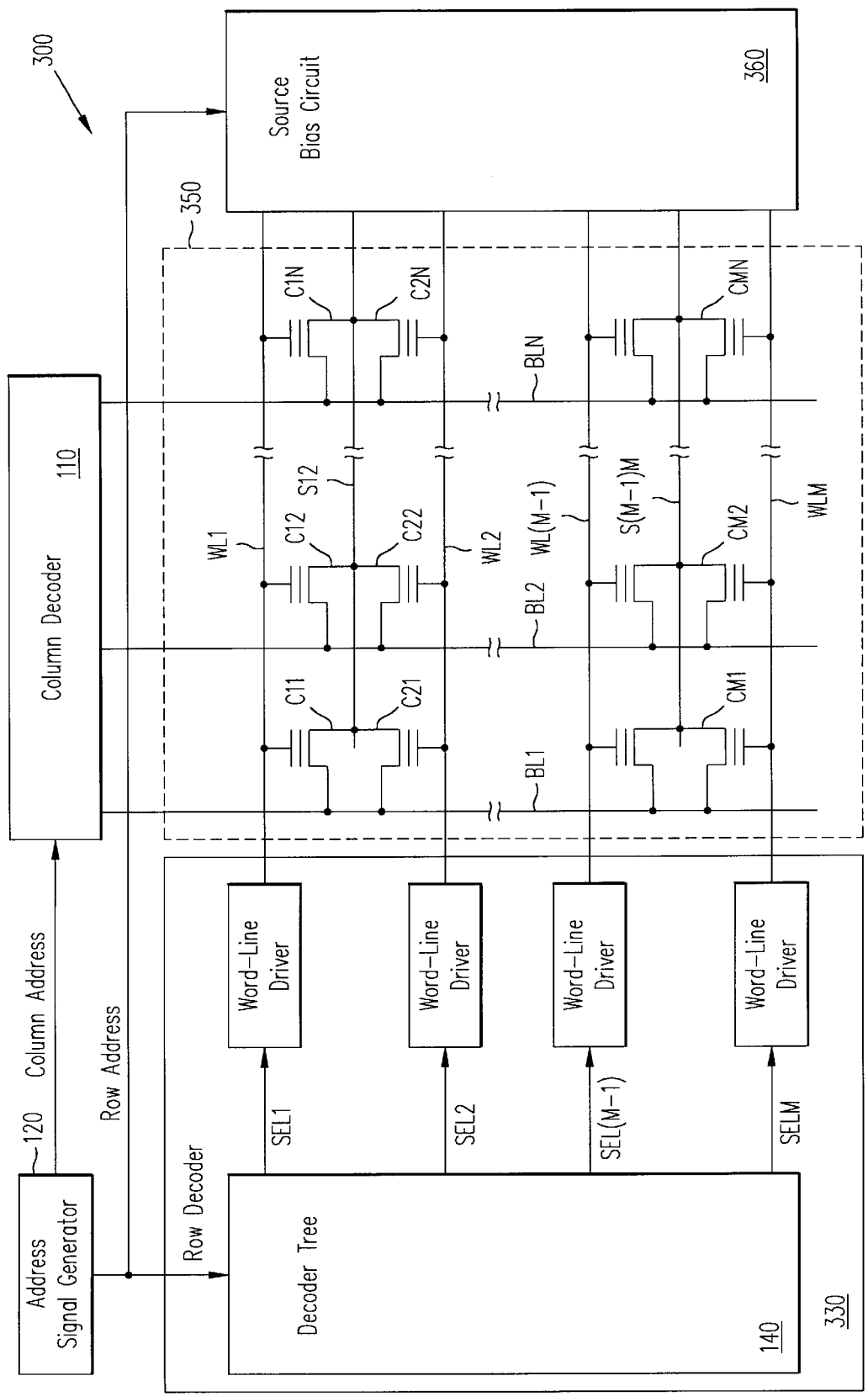
FIG. 3 is a block diagram of an embodiment of the invention that includes a memory array having two-row sectors.

FIG. 3 illustrates a memory 300 including a memory array 350 which has one source-line per pair of rows of memory cells. Memory 300 includes a column decoder 110 and an address signal generator 120 which operate as described above for memory 100 of FIG. 1. A row decoder 330 in memory 300 controls the voltage on word-lines WL1 to WLM in the same manner as described above for row decoder 130 of FIG. 1, but row decoder 330 differs from row decoder 130 in that row decoder 330 does not contain source-line bias circuits. Instead memory 300 includes source bias circuits 360 which control source-line voltages during erase and program operations.

Figure 4:
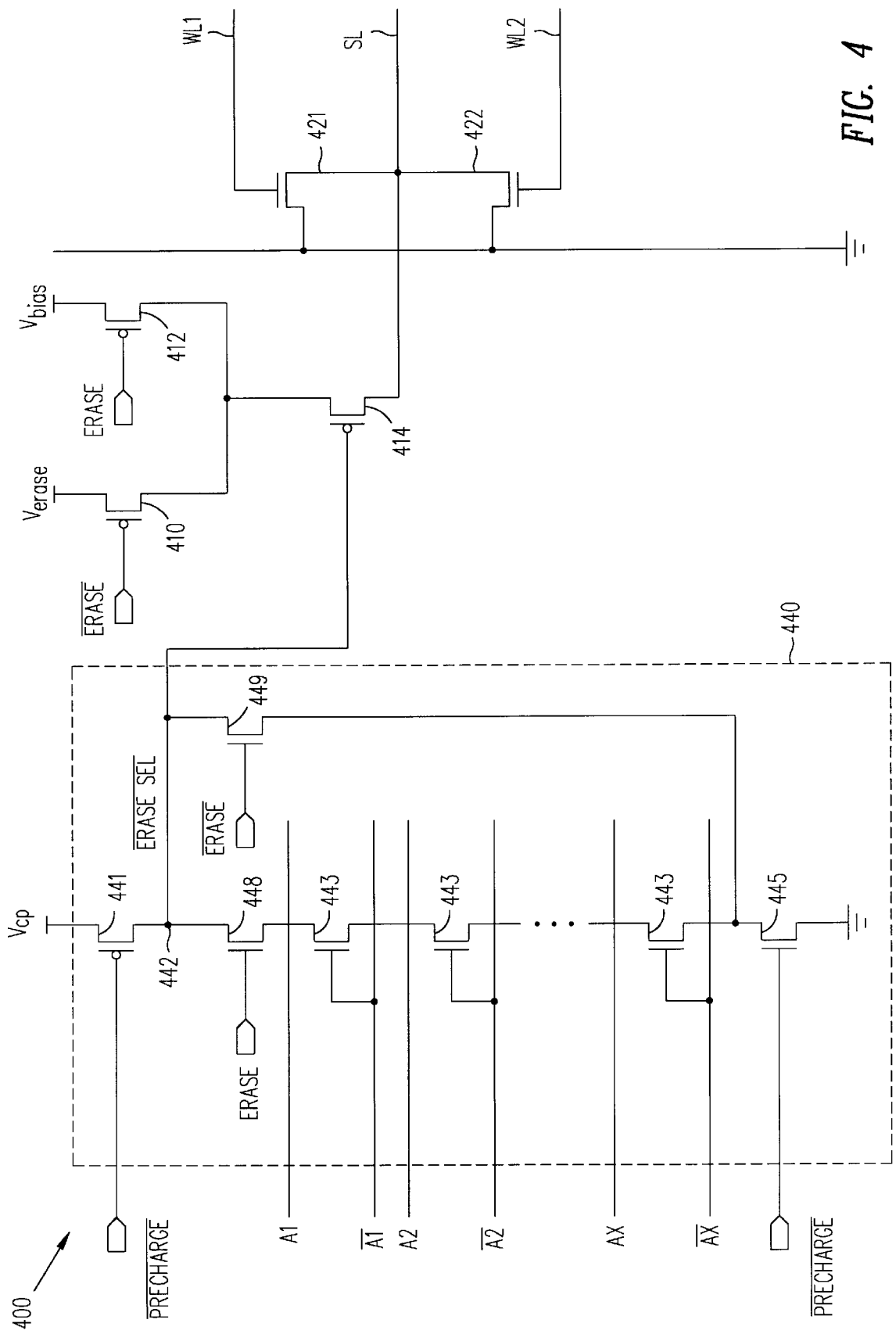
FIG. 4 is a circuit diagram of a source decoder for the embodiment of FIG. 3.

FIG. 4 shows a circuit diagram for bias circuitry 400 of a source bias circuit 360 that controls the voltage on a source-line SL during erase and program operation. Bias circuitry 400 includes a decoder tree 440 which generates a select signal $\overline{ERASESEL}$ to indicate whether an attached source-line SL should be raised to erase voltage Verase during an erase operation. Before an erase operation, signal $\overline{PRECHARGE}$ turns on a p-channel transistor 441 which charges a node 442 that provides signal $\overline{ERASESEL}$. Node 442 can be discharged through a series of transistors 443 having gates coupled to a combination of address signals A1 to AX and $\overline{AX}$ to $\overline{AX}$ that uniquely identifies attached source-line SL. FIG. 4 shows the gate connections that select source-line S12 which corresponds to the first two rows in memory array 350. The other source-lines have associated decoder trees that are similar but connect to different combinations of address signals A1 to AX and $\overline{AX}$ to $\overline{AX}$. Fewer address signals are required for source decoding than for row decoding since each source-line corresponds to two rows of memory cells. When signal $\overline{PRECHARGE}$ is deasserted (high) and signal ERASE is asserted (high), signal $\overline{ERASESEL}$ remains high unless address signals A1 to AX and $\overline{A1}$ to $\overline{AX}$ cause all of transistors 443 to conduct. For the selected source-line during an erase, signals $\overline{ERASE}$ and $\overline{ERASESEL}$ are low which turns on p-channel transistors 410 and 414 and connects source-line SL to erase voltage Verase. Two rows of memory cells can then be erased.

During programming, a selected one of word-lines WL1 to WL2 is raised to programming voltage Vpp. Each row in array 350 has an associated virtual ground device (transistor) 421 or 422 that is coupled between ground and the source-line associated with the row. The programming voltage on the selected word-line turns on a virtual ground device 421 or 422 and grounds the source-line coupled to the selected memory cell. Accordingly, during programming, row decoder 340 applies programming voltage Vpp to the selected word-line, column decoder 110 applies the programming voltage Vdp to the selected bit-line, and a virtual ground device coupled to the selected word-line grounds the selected source-line.

Additionally during programming, signal $\overline{ERASE}$ is high which turns on an n-channel transistor 449 connecting node 442 to ground through transistors 449 and 445. Accordingly, signal $\overline{ERASESEL}$ is low which turns on p-channel transistor 414. Signal ERASE turns on a high-impedance p-channel transistor 412 during programming so that every source-line in array 350 is coupled to bias voltage Vbias through transistors 412 and 414. Current through high-impedance transistor 412 pulls unselected source-lines up to bias voltage Vbias. However, the selected source-line remains near ground (voltage Vss) because the virtual ground device 421 or 422 is turned on and has lower resistance (typically an order of magnitude lower) than high-impedance transistor 412. Accordingly, during programming, the bias voltage is applied to all source-lines except the source-line coupled to the selected memory cell.

The bias voltage on the source-lines reduces the program disturb of memory cells in the same column as the selected memory cell. However, for the embodiment of FIG. 3, two rows of memory cells have a grounded source-line so that one unselected memory cell in the same column as the selected memory cell is subject to program disturb without the bias voltage being applied. However, the accumulated program disturb is reduced because a source-line bias voltage is applied during most program operations.

Although the invention has been described with reference to particular embodiments, the description is only an example of the invention's application and should not be taken as a limitation. In particular, even though much of preceding discussion was aimed at embodiments where each sector of memory cells includes either one or two rows, alternative embodiments of the invention include memories where sectors include more than two rows. Additionally, the terms source and drain herein distinguish terminals of memory cells and are consistent with the electrical properties of n-channel floating gate transistors. However, embodiments of the invention may include p-channel memory cells. Various other adaptations and combinations of features of the embodiments disclosed are within the scope of the invention as defined by the following claims.

We claim:

1. A method for writing to a selected memory cell in an array, comprising the simultaneous steps of:

applying a first voltage to a word-line coupled to a control gate of the selected memory cell;

applying a second voltage to a bit-line coupled to a drain of the selected memory cell;

applying a third voltage to a first source-line coupled to a source of the selected memory cell, wherein combined application of the first, second, and third voltage changes a threshold voltage of the selected memory cell; and applying a fourth voltage that differs from the third voltage to a second source-line, wherein the second source-line is coupled a source of an unselected memory cell that has a drain coupled to the bit-line.

2. The method of claim 1, wherein applying the third voltage comprises connecting the first source-line to ground.

3. The method of claim 2, wherein applying the fourth voltage connects the second source-line to a supply voltage.

4. The method of claim 2, wherein the fourth voltage is equal to the second voltage.

5. A non-volatile memory comprising:

an array of memory cells organized into rows and columns, the array including source-lines, wherein each source-line is coupled to memory cells in an associated row of the array;

an address decoder that generates a signal identifying a first of the source-lines, the first source-line being coupled to a memory cell selected for a write operation;

a bias circuit coupled to the address decoder and to the source-lines, wherein the bias circuit applies a first voltage to the first source-line and applies a second voltage different than the first voltage to a second of the source-lines; and bit-lines, wherein each bit-line is coupled to the memory cells in a column associated with the bit-line, and the second source-line is coupled to a memory cell that is coupled to the selected memory cell via one of the bit-lines.

6. The memory of claim 5, wherein each of the source-lines couples to memory cells in two rows of the array.

7. The memory of claim 5, wherein;

the array further comprises word-lines, wherein each word-line is coupled to control gates of the memory cells in a row associated with the word-line; and the address decoder is a row decoder that selects a word-line for application of a programming voltage during writing of the selected memory cell.

8. The memory of claim 7, wherein the bias circuit comprises:

virtual ground devices that are in one-to-one correspondence with the rows of the array, each virtual ground device comprising a transistor having a gate coupled to the address decoder via a word-line for a corresponding row, a first terminal coupled to a source-line for the corresponding row, and a second terminal coupled to a source of a reference voltage; and high-impedance transistors that are in one-to-one correspondence with the source-lines of the array, each high-impedance transistor being coupled between a corresponding source-line and a source of a bias voltage.

9. The memory of claim 5, wherein each memory cell is used for storing analog data.

10. The memory of claim 5, wherein each memory cell is used for storing multi-level data.

11. The method of claim 1, wherein applying the third voltage comprises applying said third voltage to the sources of all memory cells on the word-line associated with the selected memory cell.

12. The method of claim 1, wherein the fourth voltage comprises applying said fourth voltage to the sources of all memory cells on the word-lines associated with unselected memory cells.

13. The method of claim 1, wherein said bit-line is directly coupled to said drain and said source-line is directly coupled to said source.

14. The method of claim 1, wherein said second and fourth voltages are different.

15. The memory of claim 5, wherein the source-lines are directly coupled to the sources of said memory cells.

* * * * *